(12) United States Patent
Park et al.

(10) Patent No.: US 11,177,789 B2
(45) Date of Patent: Nov. 16, 2021

(54) ACOUSTIC WAVE DEVICE AND METHOD OF MANUFACTURING THE SAME

(71) Applicant: Samsung Electro-Mechanics Co., Ltd., Suwon-si (KR)

(72) Inventors: Seung Wook Park, Suwon-si (KR); Jae Hyun Jung, Suwon-si (KR); Seong Hun Na, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 814 days.

(21) Appl. No.: 15/996,790

(22) Filed: Jun. 4, 2018

(65) Prior Publication Data
US 2019/0140616 A1 May 9, 2019

(30) Foreign Application Priority Data
Nov. 9, 2017 (KR) .................. 10-2017-0148767

(51) Int. Cl.
| | | |
|---|---|---|
| *H03H 9/10* | (2006.01) | |
| *H03H 3/08* | (2006.01) | |
| *H03H 9/02* | (2006.01) | |
| *H03H 3/007* | (2006.01) | |
| *H03H 3/02* | (2006.01) | |
| *H03H 9/05* | (2006.01) | |
| *H03H 9/46* | (2006.01) | |

(52) U.S. Cl.
CPC ............. *H03H 9/10* (2013.01); *H03H 3/007* (2013.01); *H03H 3/02* (2013.01); *H03H 3/08* (2013.01); *H03H 9/02984* (2013.01); *H03H 9/059* (2013.01); *H03H 9/0523* (2013.01); *H03H 9/1014* (2013.01); *H03H 9/1071* (2013.01); *H03H 9/46* (2013.01)

(58) Field of Classification Search
CPC .......... H03H 9/10; H03H 9/1014; H03H 3/02; H03H 3/08; H03H 9/1071; H03H 9/0523; H03H 9/02894; H03H 9/059; H03H 3/007; H03H 9/46
USPC .......................................... 333/133, 193–196
See application file for complete search history.

(56) References Cited

U.S. PATENT DOCUMENTS

| | | | |
|---|---|---|---|
| 2003/0132517 A1 | 7/2003 | Matsuta et al. | |
| 2012/0086309 A1* | 4/2012 | Yamaji ................. | H03H 9/1092 310/313 B |
| 2013/0087379 A1 | 4/2013 | Grama et al. | |

FOREIGN PATENT DOCUMENTS

| | | |
|---|---|---|
| JP | 2005-236474 A | 2/2005 |
| JP | 4173308 B2 | 10/2008 |

* cited by examiner

*Primary Examiner* — Robert J Pascal
*Assistant Examiner* — Jorge L Salazar, Jr.
(74) *Attorney, Agent, or Firm* — NSIP Law

(57) ABSTRACT

An acoustic wave device includes a substrate, a support portion and a protective member. The substrate has an acoustic wave generator formed on a surface thereof. The support portion is disposed on the surface of the substrate, and includes an accommodating space configured to accommodate the acoustic wave generator. The protective member is coupled to the support portion and disposed to be spaced apart from the acoustic wave generator by a predetermined interval. The protective member is disposed in a seating groove formed in the support portion.

21 Claims, 6 Drawing Sheets

ACOUSTIC WAVE DEVICE AND METHOD OF MANUFACTURING THE SAME

CROSS-REFERENCE TO RELATED APPLICATION(S)

This application claims the benefit under 35 USC 119(a) of Korean Patent Application No. 10-2017-0148767 filed on Nov. 9, 2017 in the Korean Intellectual Property Office, the entire disclosure of which is incorporated herein by reference for all purposes.

BACKGROUND

1. Field

The present disclosure relates to an acoustic wave device and a method of manufacturing the same.

2. Description of Related Art

A band pass filter is a key component in a communications device and selects only a signal within a required frequency band from among various frequency bands to transmit and receive the selected signal.

Recently, for such a band pass filter, an acoustic wave device has been widely used. In the acoustic wave device, a filter is generally implemented using an element having a thin film form resonates a piezoelectric dielectric material deposited on a silicon wafer, a semiconductor substrate, using piezoelectric characteristics of the deposited piezoelectric dielectric material.

Examples of the acoustic wave device may include a surface acoustic wave (SAW) filter, a bulk acoustic wave (BAW) filter, and the like.

A plurality of acoustic wave devices may be mounted on the substrate and used in a form of a module. Application fields of the acoustic wave device may include small and lightweight filters of mobile communications devices, chemical and biological devices, and the like, oscillators, acoustic resonance mass sensors, and the like.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an acoustic wave device includes a substrate, a support portion and a protective member. The substrate has an acoustic wave generator formed on a surface thereof. The support portion is disposed on the surface of the substrate, and includes an accommodating space configured to accommodate the acoustic wave generator. The protective member is coupled to the support portion and disposed to be spaced apart from the acoustic wave generator by a predetermined interval. The protective member is disposed in a seating groove formed in the support portion.

The seating groove may be continuously formed along an inner wall of the support portion forming the accommodating space.

The seating groove may be formed in a groove having a step contour along an edge of the inner wall of the support portion.

An outer surface of the protective member may be disposed to be lower or higher than an outer surface of the support portion.

The acoustic wave device may further include an encapsulating portion disposed to cover a surface formed by the protective member and the support portion.

The encapsulating portion may be formed of an insulator.

The acoustic wave device may further include an airtight layer disposed between the surface formed by the protective member and the support portion and the encapsulating portion. The airtight layer may be configured to prevent moisture or foreign materials from entering the acoustic wave generator.

The airtight layer may extend to a side surface of the support portion.

The airtight layer may be formed of an inorganic insulating film or a thin film.

The acoustic wave device may further include an airtight layer disposed along a surface formed by the support portion and the encapsulating portion to prevent moisture or foreign materials from entering the acoustic wave generator.

In another general aspect, a method of manufacturing an acoustic wave device, includes: preparing a substrate having an acoustic wave generator formed on one surface thereof; disposing a support portion and a protective member along a circumference of the acoustic wave generator on one surface of the substrate, wherein the protective member is partially embedded in the support portion; and forming an encapsulating portion configured to encapsulate the support portion and the protective member.

The forming of the protective member may include: preparing the protective member on a carrier substrate; forming the support portion along an edge of the protective member; transferring the protective member and the support portion to one surface of the substrate; and removing the carrier substrate.

The method may further include: forming a metal layer on the carrier substrate; forming a first pattern by forming and patterning a first mask layer on the metal layer; and forming the protective member by filling a conductive material in the first pattern.

The forming of the support portion may further include forming an opening in the support portion.

The method may further include, after the disposing of the support portion and the protective member, forming a connection conductor by filling a conductive material in the opening.

The method may further include, before the forming of the encapsulating portion, forming an airtight layer along surfaces of the support portion and the protective member to prevent moisture or foreign materials from entering the acoustic wave generator.

In another general aspect, an acoustic wave device includes a support portion, a seating groove, and a protective member. The support portion is disposed on a substrate, and has a through hole configured to accommodate an acoustic wave generator. The seating groove is defined on an inner upper surface contour of the through hole on the support portion. The protective member is disposed over the through hole, and configured to seat in the seating groove.

The acoustic wave device may further include an airtight layer disposed between an encapsulating layer and upper surfaces of the support portion and the protective member.

The upper surfaces of the support portion and the protective member may be on different planes.

The upper surfaces of the support portion and the protective member may be on a same plane.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
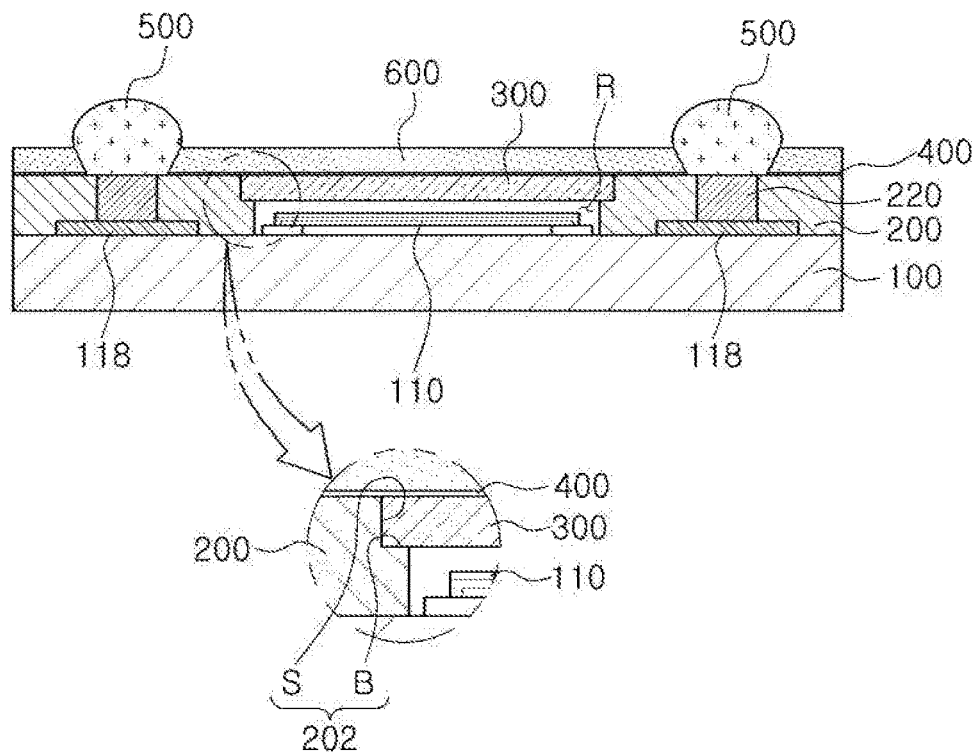
FIG. 1 is a cross-sectional view schematically illustrating an example of an acoustic wave device.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a cross-sectional view schematically illustrating an example of an acoustic wave device in the present disclosure.

Referring to FIG. 1, an acoustic wave device includes a substrate 100, a support portion 200, a protective member 300, an airtight layer 400, and an encapsulating portion 600. Here, the acoustic wave device is conceptualized to include a filter element that passes approved frequency bands, such as a surface acoustic wave filter, a bulk acoustic wave filter, a duplexer, and the like.

In a case in which the acoustic wave device is the SAW filter, the substrate 100 may be provided as a piezoelectric substrate, and in a case in which the acoustic wave device is the BAW filter, a Si substrate may be used. For example, the substrate 100 may be formed of single crystal such as $LiTaO_3$, $LiNbO_3$, $Li_2BO_7$, $SiO_2$, silicon, or the like. Together with any one or any combination of any two or more of the materials described above, lead zirconium titanate (PZT) based polycrystal or a zinc oxide (ZnO) thin film may be used.

However, the substrate 100 used for the acoustic wave device is not limited to the above-mentioned example, and may be substituted with various substrates which are widely used in the art.

An acoustic wave generator 110 is formed on one surface of the substrate 100. The acoustic wave generator 110 may include an interdigital transducer (IDT) electrode or a piezoelectric thin film resonator that converts an electrical signal into a mechanical signal or converts the mechanical signal into the electrical signal.

For example, in a case in which the acoustic wave device is used as the surface acoustic wave filter, the acoustic wave generator 110 may be provided as a metal electrode, and in a case in which the acoustic wave device is used as the bulk acoustic wave filter, the acoustic wave generator 110 may be formed in a structure in which a piezoelectric element and an electrode are stacked.

The acoustic wave generator 110 may be formed as a piezoelectric thin film resonator in which a piezoelectric thin film is stacked. Therefore, the acoustic wave generator 110 may form a resonating part by upwardly sequentially stacking a lower electrode, a piezoelectric layer, and an upper electrode.

However, the configuration of the present disclosure is not limited thereto. In a case in which the acoustic wave generator 110 is the IDT electrode, the acoustic wave generator 110 may be formed of aluminum or copper, and may be formed in a structure in which a plurality of electrodes are alternately intersected in a comb form. In this case, the acoustic wave generator 110 may be formed by forming a metal layer on the substrate 100 and machining the metal layer into a predetermined electrode form by a photolithography method.

The support portion 200 and an electrode member 118 may be disposed on one surface of the substrate 100. The electrode member 118 may be electrically connected to the acoustic wave generator 110 through a wiring pattern (not shown) formed on the substrate 100. In addition, the electrode member 118 may be bonded to the connection conductor 220 to be described below.

The support portion 200 may be formed in a form covering the electrode member 118 connected to the acoustic wave generator 110. However, the support portion 200 is not limited thereto, but may also be disposed so that a portion or all of the electrode member 118 is exposed to the outside.

The support portion 200 may be continuously formed in a form surrounding a circumference of the acoustic wave generator 110. Therefore, the support portion 200 may include an accommodating space R in which the acoustic wave generator 110 is disposed.

The support portion 200 may be formed of an insulating material such as a resin or polymer. However, the material of the support portion 200a is not limited thereto and the supporting layer 200a may also be formed of a metal material, as needed.

In addition, the support portion 200 may protrude on a surface of the substrate 100 by a predetermined height. In this case, the protruding height of the support portion 200 may be greater than a height of the acoustic wave generator 110. Accordingly, a gap may be formed between the protective member 300 coupled to the support portion 200 and the acoustic wave generating part 110.

However, the structure of the support portion 200 is not limited to the above-mentioned configuration, and may be variously changed as long as it is a structure in which a gap is formed between the protective member 300 and the acoustic wave generator 110.

At least one connection conductor 220 is disposed in the support portion 200.

The connection conductor 220, which is a conductive member disposed to penetrate through the support portion 200, may have one end connected to the electrode member 118 of the substrate 100 and the other end coupled to a connection terminal 500.

The connection conductor 220 may be formed by filling a hole penetrating through the support portion 200 with a conductive material or applying the conductive material onto an inner surface of the hole. The conductive material forming the conductive conductor 220 may be copper (Cu), silver (Ag), gold (Au), nickel (Ni), platinum (Pt), lead (Pd), or an alloy thereof, but is not limited thereto.

A seating groove 202 may be formed in the support portion 200.

The seating groove 202, which is a groove to which the protective member 300, to be described below, is coupled. The seating groove 202 may be continuously formed along an inner wall of the accommodating space R in which the acoustic wave generator R is disposed and may have a step form along an upper end edge of the inner wall.

More specifically, the seating groove 202 may include a bottom surface B and a side wall S. The bottom surface B is a surface positioned below the protective member 300 to support the protective member 300. In addition, the side wall S, which is a surface facing a side surface of the protective member 300, may be disposed to be in contact with the side surface of the protective member 300 or to be very adjacent thereto.

According to the present example, may be perpendicular to each other. However, the structure formed by the bottom surface B and the side wall S is formed to correspond to abutting surfaces of the protective member 300; thus, the configuration of the disclosed herein may vary accordingly. When the contours of the protective member 300 are changed, the layout structure or the contours of the bottom surface B and the side wall S may also change correspondingly.

According to the present example, the depth of the seating groove 202 may be the same as or similar to a thickness of the protective member 300. Thus, when the protective member 300 is disposed in the seating groove 202, the protective member 300 may not protrude to an upper portion of the support portion 200, and an upper surface of the protective member 300 may be disposed on the same plane as an upper surface of the support portion 200.

However, the configuration of the present disclosure is not limited thereto and may be variously modified. For example, as to be described below, a portion of the protective member 300 may protrude to the upper portion of the support portion 200 or may be disposed below the upper surface of the support portion.

In addition, the distance between opposing seating grooves 202 facing each other may be the same as or similar to the width of the protective member 300 so that the protective member 300 may be stably and securely seated in the seating groove 202. Therefore, of the contour of the side wall S may be the same as the contour of the protective member 300.

The protective member 300 may protect the acoustic wave generator 110 from an external environment. The protective member 300 may be formed to entirely cover an upper portion of the acoustic wave generator 110.

The protective member 300 may be formed in a flat substrate form, and may be seated in the seating groove 202 of the support portion 200.

The protective member 300 may be disposed to be spaced apart from the acoustic wave generator 110 by the support portion 200. Therefore, a gap may be formed between the acoustic wave generator 110 and the protective member 300 based on a support provided by the support portion 200, and the gap may be used as an accommodation space of the acoustic wave generator 110 when the acoustic wave device is driven. As a result, when the acoustic wave generator 110 resonates, the acoustic wave generator 110 may not be in contact with the protective member 300.

In order to provide rigidity, the protective member 300 may be formed of a metal material (e.g., copper and nickel). According to the present exemplary embodiment, the protective member 300 is formed of nickel (Ni), but the material of the protective member 300 is not limited thereto. For example, the protective member 300 may be formed of other metals other than nickel (Ni), and may also be formed by stacking a plurality of metal layers. In addition, the protective member 300 may also be formed of other material such as a resin and the like, as long as these materials may provide the same rigidity as the metal.

The protective member 300 may be inserted into the seating groove 202 of the support portion 200 and may be coupled to the support portion 200.

Accordingly, the protective member 300 may be coupled to the support portion 200 in a form in which it is embedded in the support portion 200.

The protective member 300 may be in contact with both the bottom surface B and the side wall S in which the seating groove 202 of the support portion 200 is formed, and may be coupled to the support portion 200. In this case, since a bonded area between the protective member 300 and the support portion 200 is increased as compared to a structure in which the protective member 300 is seated on the upper surface of the support portion 200, bonding reliability between the protective member 300 and the support portion 200 may be increased.

The protective member 300 may be separately manufactured and may be then bonded onto the support portion 200. However, the protective member 300 is not limited thereto and may be formed by various methods as needed. For example, as in a manufacturing method to be described below, the protective member 300 and the support portion 200 may be integrally formed and may be then transferred to the substrate 100.

The connection terminal 500 may be disposed on an outer surface of the support portion 200, and may be electrically connected to the acoustic wave generator 110 through the connection conductor 220.

The connection terminal 500 may electrically and physically connect a main board (or a package board), on which the acoustic wave device is mounted, and the acoustic wave device to each other.

The connection terminal 500 may be formed in a form of a solder ball or a solder bump, but is not limited thereto.

The airtight layer 400 may be formed to fully seal a bonded surface between the protective member 300 and the support portion 200. More specifically, the airtight layer 400 may be disposed between a surface formed by the protective member 300 and the support portion 200, and an encapsulating portion 600 to be described below to prevent moisture or foreign materials from entering the acoustic wave generator 110.

The airtight layer 400 may be formed of a thin film layer. For example, the airtight layer 400 may be formed of a thin film layer such as an inorganic insulating film or an oxide film including any one or any combination of any two or more components selected from the group consisting of silicon nitride ($Si_xN_y$), silicon dioxide ($SiO_2$), silicon oxynitride ($SiO_xN_y$), and silicon carbide (SiC).

The airtight layer 400 may be formed by a chemical deposition method, and may be formed, for example, by plasma enhanced chemical vapor deposition (PECVD).

By forming such an airtight layer 400, moisture-proofing performance of the acoustic wave device may be improved. However, in a case in which the encapsulating portion 600 to be described below sufficiently performs a function of the airtight layer 400, the airtight layer 400 may be omitted.

The encapsulating portion 600 may be formed of a thin film insulator, and may protect the airtight layer 400, the support portion 200, and the protective member 300 from an external environment.

The encapsulating portion 600 may be formed by applying an insulating material such as solder resist onto a surface of the airtight layer 400. However, the material of the encapsulating portion 600 is not limited thereto, and the encapsulating portion 600 may be formed of various materials as long as they are easily coupled to the airtight layer 400 and may protect the airtight layer 400 from the outside.

For example, the material of the encapsulating portion 600 may be a thermosetting resin such as epoxy, a thermoplastic resin such as polyimide, a photo-curable resin, and the like. In addition, in order to provide rigidity, prepreg having a reinforcement material such as glass fiber or inorganic filler impregnated in the above-mentioned resins may also be used.

Next, a method of manufacturing the acoustic wave device illustrated in FIG. 1 will be described with reference to FIGS. 2 through 5.

Figure 2:
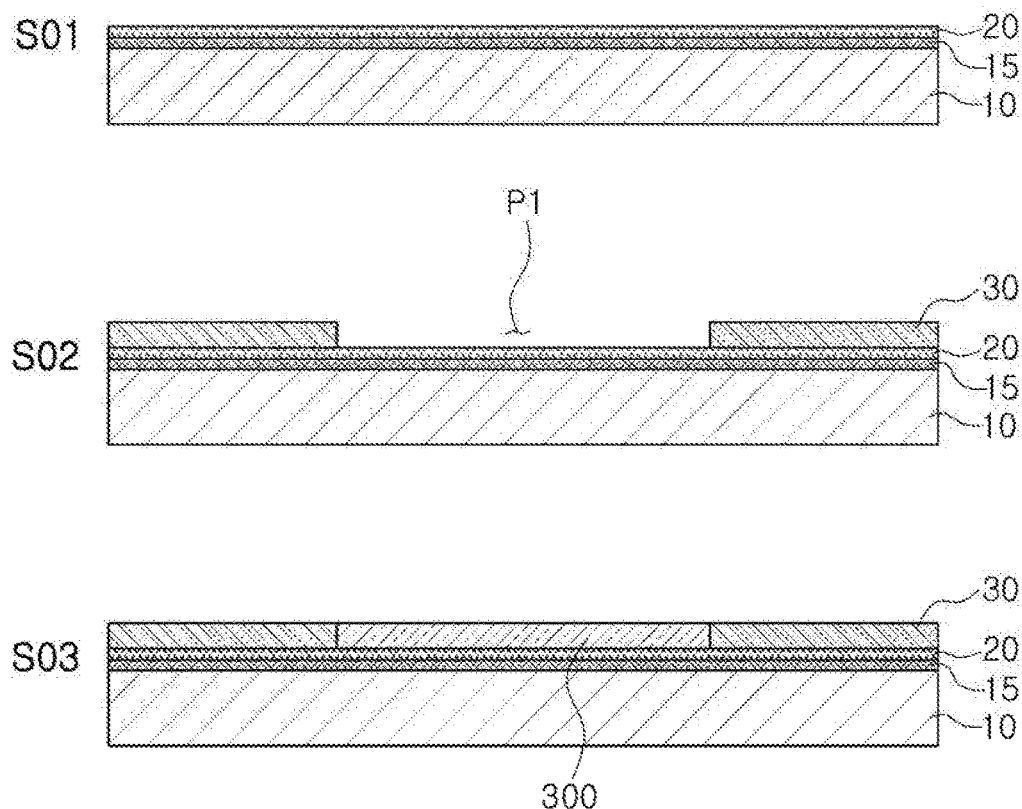
FIGS. 2 through 5 are views schematically illustrating an example of a method of manufacturing an acoustic wave device.
Figure 3:
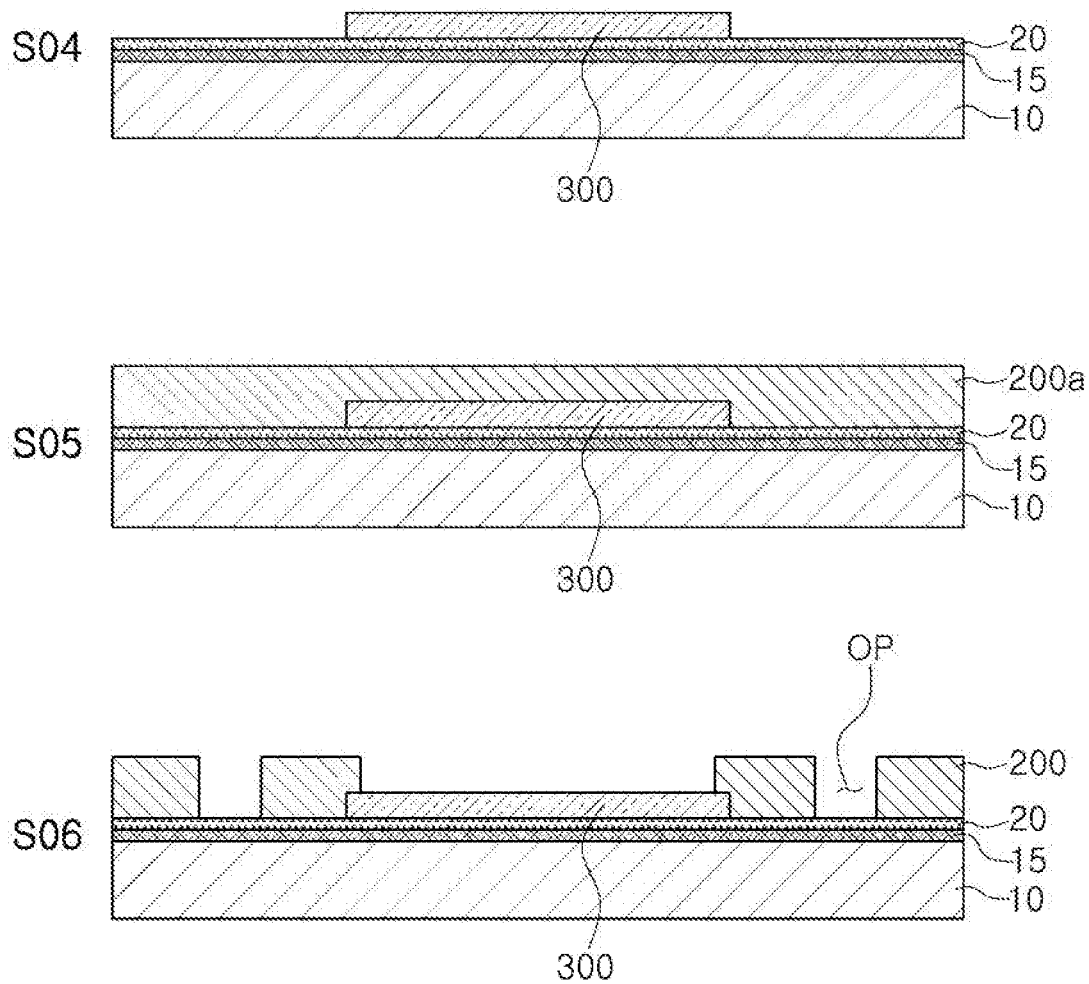
Figure 4:
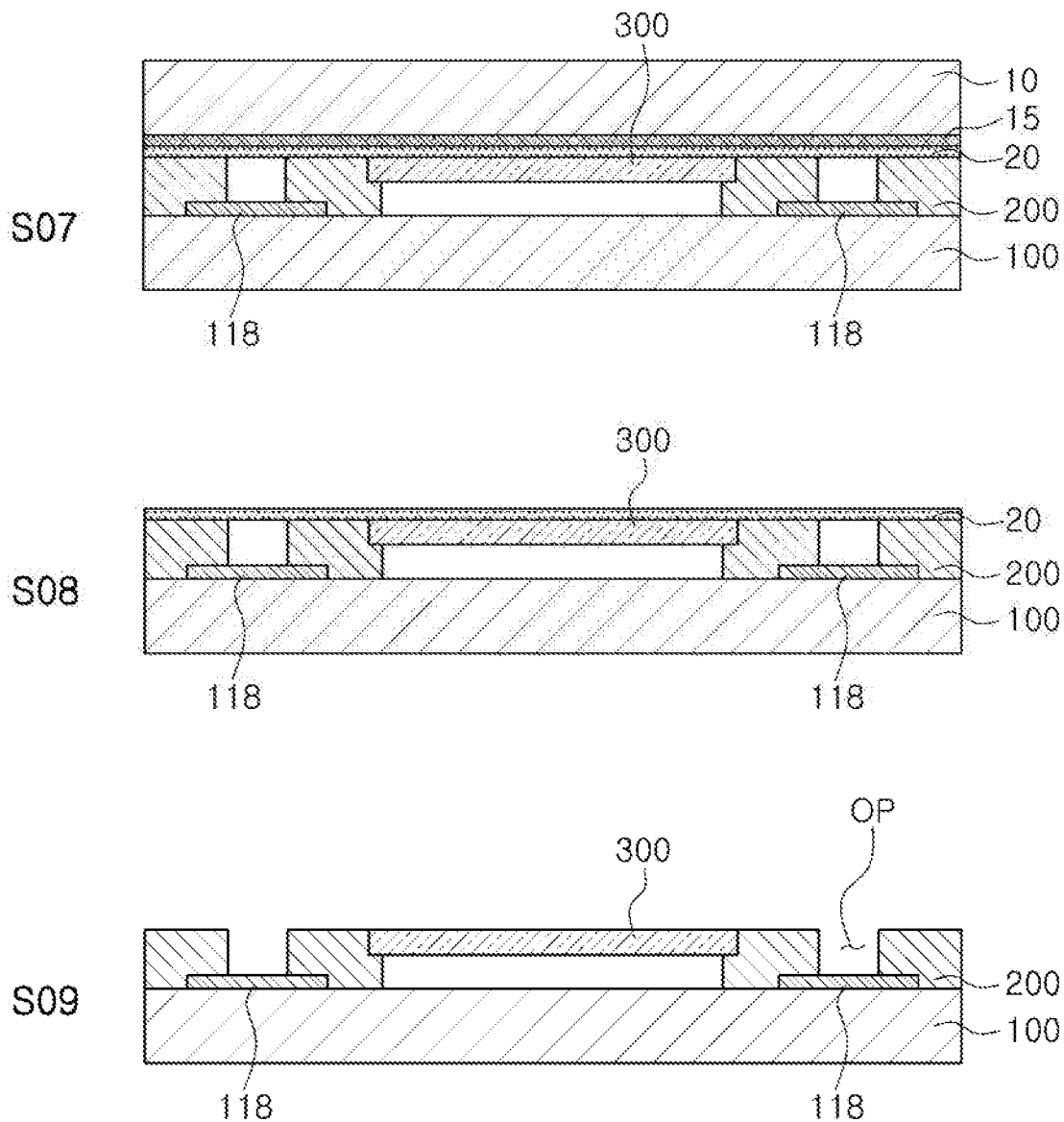
Figure 5:
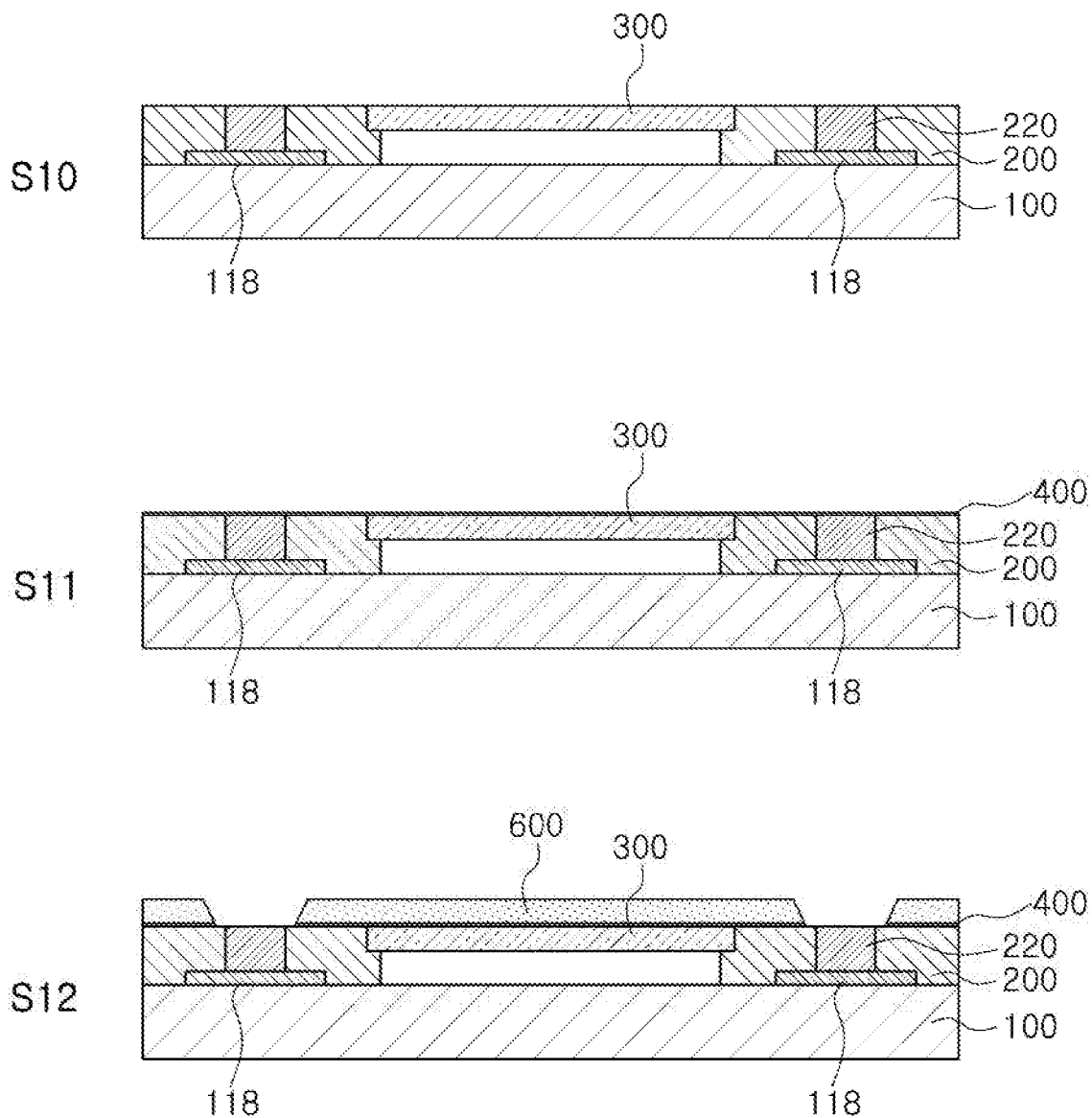

First, as illustrated in FIG. 2, a metal layer 20 may be formed on a carrier substrate 10 (S01). Here, the metal layer 20 may be formed of copper (Cu). In addition, the metal layer 20 may be disposed on the carrier substrate 10 through a bonding member 15 such as an adhesive tape.

Next, after a first mask layer 30 is formed on the metal layer 20, the first mask layer 30 may be partially etched to form a first pattern P1 (S02). The first pattern P1 may be formed in a form penetrating through the first mask layer 30.

The first mask layer 30 may be formed of a dry film photoresist (DFR) or a photoresist (PR), but is not limited thereto.

In addition, as the first pattern P1 is formed on the first mask layer 30, a portion of the metal layer 20 may be exposed to the outside through the first pattern P1.

Next, the protective member 300 may be formed by filling a conductive material in the first pattern P1 of the first mask layer 30 (S03). The present operation may be performed by a plating process or a silk screen method. For example, the protective member 300 may be formed by performing nickel (Ni) plating in the first pattern P1.

In addition, the protective member may also be formed by stacking a plurality of metal layers. For example, after a nickel (Ni) layer is formed in the first pattern P1 through a plating process, the protective member 300 may also be formed by stacking a copper (Cu) layer or another plating layer on the nickel (Ni) layer.

Next, the first mask layer 30 may be removed (S04). As a result, only the protective member 300 remains on the metal layer 20.

Next, a supporting layer 200a may be stacked on the metal layer 20 (S05). The supporting layer 200a may be formed in a form covering the entirety of the metal layer 20 and the protective layer 300, but may also be partially formed as needed.

As the supporting layer 200a is disposed to cover the entirety of the protective member 300, the protective member 300 may be embedded in the supporting layer 200a. Accordingly, the protective member 300 may be disposed to be inserted into the seating groove 202 (FIG. 1) described above.

In addition, both the supporting layer 200a and the protective member 300 may be disposed on a plane formed by the metal layer 20. Therefore, as illustrated in FIG. 1, an upper surface of the supporting layer 200a and an upper surface of the protective member 300 may be finally disposed on the same plane.

The supporting layer 200a may be formed later as the support portion 200. Therefore, the supporting layer 200a may be formed of an insulating material such as a resin or polymer. However, the material of the supporting layer 200a is not limited thereto and the supporting layer 200a may also be formed of a metal material, as needed.

Next, the support portion 200 may be formed by removing an unnecessary portion of the supporting layer 200a (S06). During this process, an opening OP may be formed by partially removing an inner portion of the support portion 200. The opening OP may be formed in a form fully penetrating through the support portion 200. As a result, the metal layer 20 may be exposed to the outside through the opening OP. The opening OP may be later used to form the connection conductor 220.

Next, after the substrate 100 on which the acoustic wave generator 110 is formed is prepared, a structure formed on the carrier substrate 10 may be transferred to the substrate 100 (S07). In this case, the structure may be transferred so that the support portion 200 is in contact with the substrate 100.

If the transfer is completed, the carrier substrate 10 may be removed (S08). As a result, the metal layer 20 may be exposed to the outside. In this operation, the adhesive member 15 may also be removed together with the carrier substrate 10.

Next, the metal layer 20 may be removed (S09). As a result, the opening OP may be exposed to the outside. The metal layer 20 may be removed by an etching method, but is not limited thereto.

Next, a connection conductor 220 may be formed by filling a conductive material in the opening OP (S10). The present operation may be performed by a plating process or a silk screen method, but is not limited thereto.

However, in order to form the connection conductor 220, although not illustrated, an operation of forming a seed layer in the opening OP may be further performed.

In this case, the connection conductor 220 may be completed by an operation of forming a seed layer on a surface from which the metal layer 20 is removed and in the opening OP, an operation of forming a second mask layer on the seed layer, an operation of forming the connection conductor 220 by filling a conductive material in the opening OP, and an operation of removing an unnecessary second mask layer and seed layer. In this case, the seed layer may be formed of a material such as titanium (Ti), aluminum (Al), copper (Cu), or the like, but the material of the seed layer is not limited thereto.

Next, an airtight layer 400 may be formed on the surface formed by the support portion 200 and the protective member 300 (S11). As described above, the airtight layer 400 may be formed of a thin film layer such as an inorganic insulating film or an oxide film including any one or any combination of any two or more components selected from the group consisting of silicon nitride ($Si_xN_y$), silicon dioxide ($SiO_2$), silicon oxy-nitride ($SiO_xN_y$), and silicon carbide (SiC). However, the material of the airtight layer 400 is not limited thereto.

Next, an encapsulating portion 600 may be formed on the airtight layer 400 (S08). The encapsulating portion 600 may be formed by applying an insulating material such as solder resist onto a surface of the airtight layer 400 and then partially removing the insulating material to expose the connection conductor 220.

Next, the acoustic wave device illustrated in FIG. 1 may be completed by forming a connection terminal 500 on the exposed connection conductor 220.

However, in the present example, a method of forming up to the support portion 200 on the carrier substrate 10 and then transferring the support portion 200 to the substrate 100 is illustrated as an example, but a configuration of the present disclosure is not limited thereto. Various modifications are possible. For example, after the support portion 200 is formed directly on the substrate 100 without forming the support portion 200 on the carrier substrate 10, the protective member 300 formed on the carrier substrate 10 may be transferred onto the support portion 200 of the substrate 100.

In addition, various modifications are possible. For example, the acoustic wave device may be formed by sequentially stacking the respective members on the substrate 100 without using the carrier substrate 10.

In one example of the acoustic wave device configured as described above, the protective member may be disposed in the support portion without protruding to the outside of the support portion. As a result, the surfaces of the protective member and the support portion may be disposed on the same plane.

Therefore, an occurrence of a crack in the airtight layer or the encapsulating portion due to a gap or a step formed between the protective member and the support portion may be prevented. As a result, airtightness of the space in which the acoustic wave generator is disposed may be significantly increased.

In addition, since the airtight layer or the encapsulating portion is disposed on the plan, the acoustic wave device may be formed to have the same thickness as a whole. Therefore, the acoustic wave device may increase airtight reliability and may be easily manufactured as compared to a case in which the airtight layer or the encapsulating portion is formed along a curvature.

However, the configuration of the present disclosure is not limited to the examples described above and may be variously modified.

FIGS. 6 through 9 are cross-sectional views schematically illustrating another example of an acoustic wave device in the present disclosure.

Figure 6:
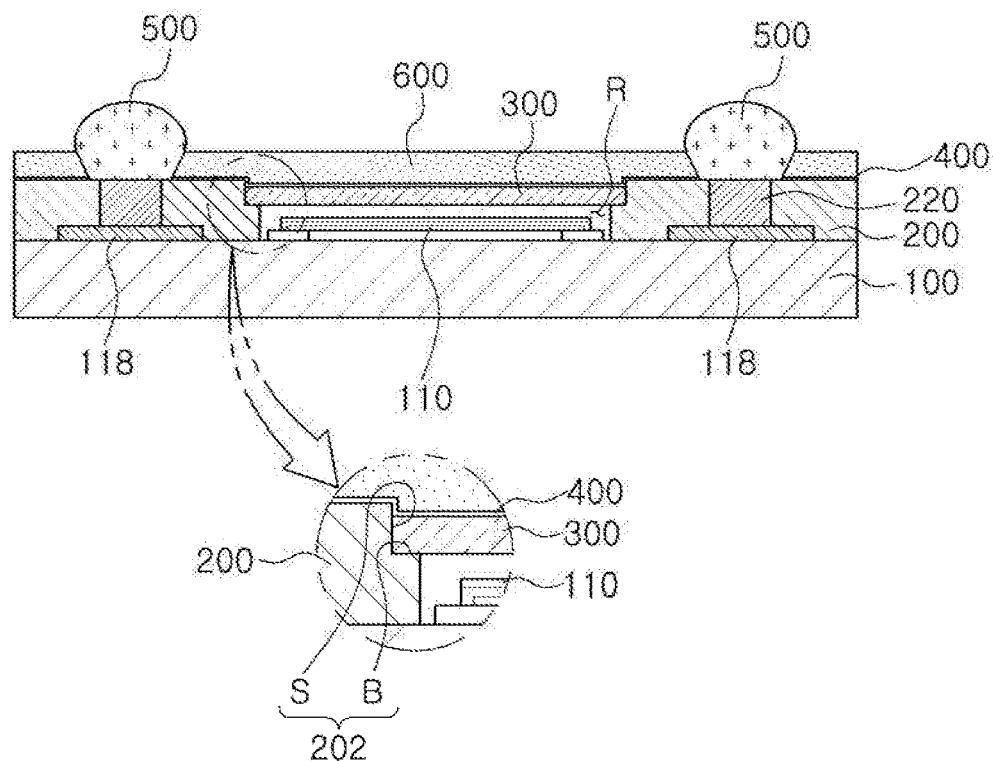
FIGS. 6 through 9 are cross-sectional views schematically illustrating another example of an acoustic wave device.

Referring to FIG. 6, an acoustic wave device may have a thickness of the protective member 300 being smaller than a depth of the seating groove 202. Accordingly, the upper surface of the protective member 300 may be disposed at a position lower than the upper surface of the support portion 200 in relation to the drawings.

The protective member 300 according to the present example may be formed by etching a portion of the protective member 300 in the operation (S09) or the operation (S10) described above. However, the formation of the protective material 300 is not limited thereto.

Figure 7:
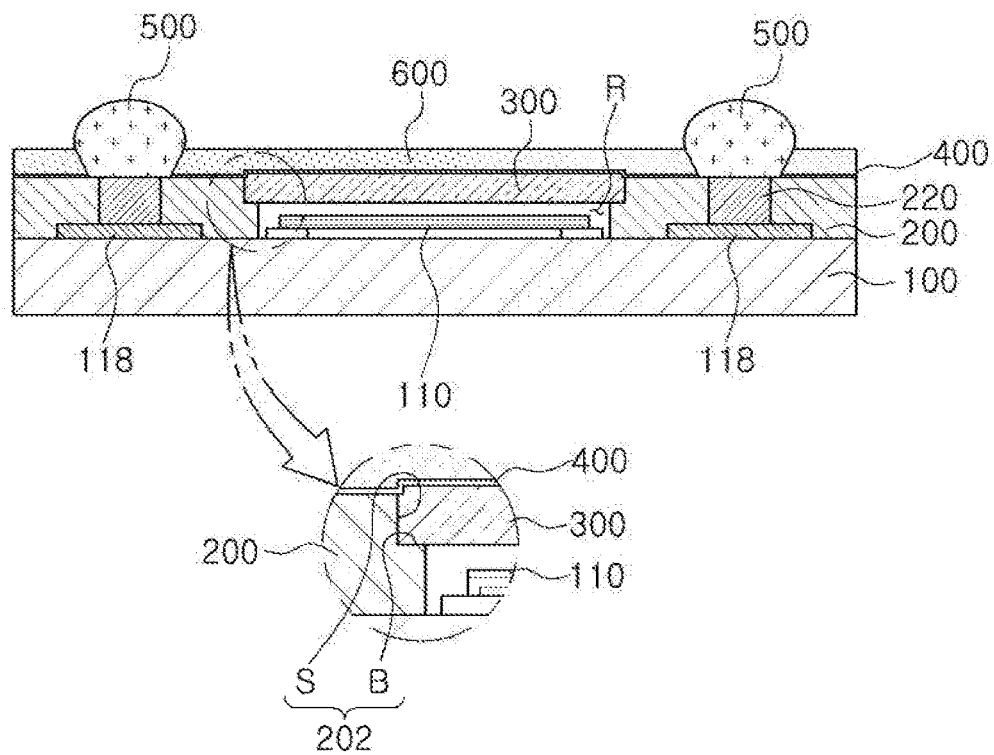

In FIG. 7, the acoustic wave device may have a thickness of the protective member 300 greater than a depth of the seating groove 202. Accordingly, the upper surface of the protective member 300 may be disposed at a position higher than the upper surface of the support portion 200 in relation to the drawings.

The protective member 300 according to the present example may be formed by stacking a metal layer on an upper surface of the protective member 300 in the operation (S09) or the operation (S10) described above. Here, the metal layer may be formed by a plating process. However, the formation method of the metal layer is not limited thereto.

As such, the thickness of the protective member 300 may be implemented in various forms as needed.

Figure 8:
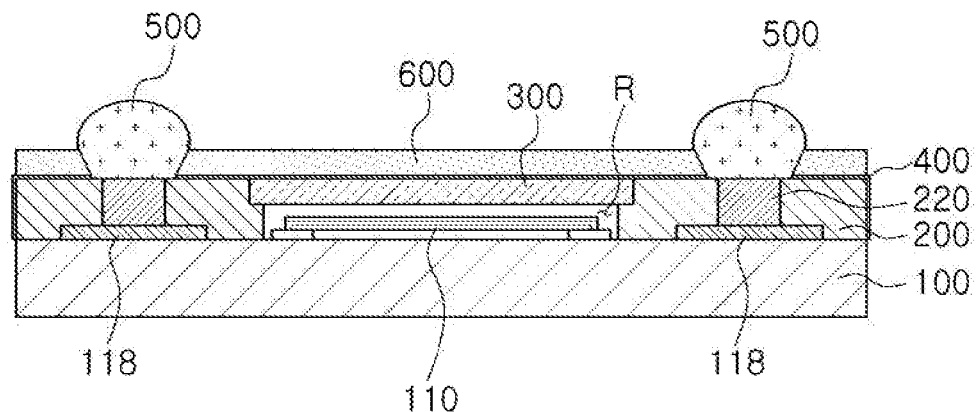

Referring to FIG. 8, the acoustic wave device may have the airtight layer 400 extending to a side surface of the support portion 200.

Figure 9:
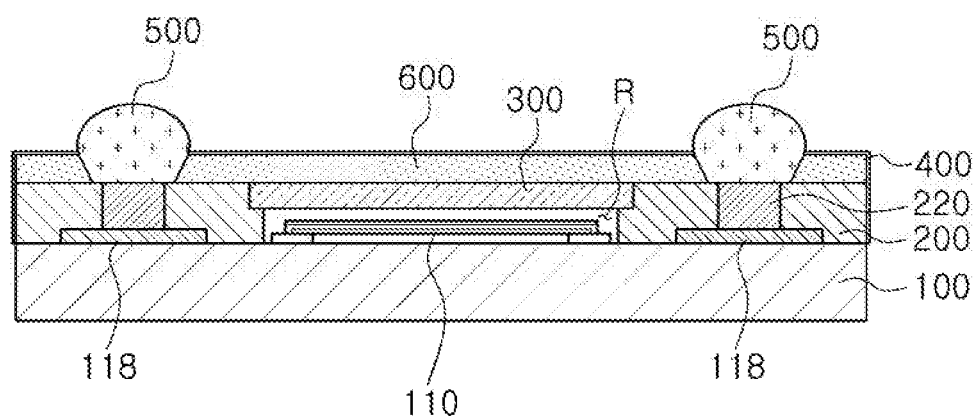

In addition, referring to FIG. 9, the acoustic wave device may have the airtight layer 400 which is not disposed between the support portion 200 and the encapsulating portion 600 and is disposed along a surface formed by the support portion 200 and the encapsulating portion 600.

As described above, the airtight layer 400 may be disposed in various forms as long as it may prevent moisture or foreign material from entering the acoustic wave generator 110.

As set forth above, according to the exemplary embodiments in the present disclosure, since the acoustic wave device has the protective member embedded in the support portion, airtightness of the space in which the acoustic wave generator is disposed may be significantly increased.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An acoustic wave device, comprising:
   a substrate having an acoustic wave generator formed on a surface thereof;
   a support portion disposed on the surface of the substrate, and comprising an accommodating space configured to accommodate the acoustic wave generator; and
   a protective member coupled to the support portion, and spaced apart from the acoustic wave generator by an interval,
   wherein the protective member is disposed in a seating groove having a ledge formed in the support portion.

2. The acoustic wave device of claim 1, wherein the seating groove is continuously formed along an inner wall of the support portion forming the accommodating space.

3. The acoustic wave device of claim 2, wherein the seating groove is formed in a groove having a step contour along an edge of the inner wall of the support portion.

4. The acoustic wave device of claim 1, wherein an outer surface of the protective member is disposed to be lower or higher than an outer surface of the support portion.

5. The acoustic wave device of claim 1, further comprising an encapsulating portion covering a surface formed by the protective member and the support portion.

6. The acoustic wave device of claim 5, wherein the encapsulating portion is formed of an insulator.

7. The acoustic wave device of claim 5, further comprising an airtight layer disposed between the encapsulating portion and the surface formed by the protective member, wherein the airtight layer is configured to prevent moisture or foreign materials from entering the acoustic wave generator.

8. The acoustic wave device of claim 7, wherein the airtight layer extends to a side surface of the support portion.

9. The acoustic wave device of claim 8, wherein the airtight layer is formed of an inorganic insulating film or a thin film.

10. The acoustic wave device of claim 5, further comprising an airtight layer disposed along a surface formed by the support portion and the encapsulating portion, and configured to prevent moisture or foreign materials from entering the acoustic wave generator.

11. The acoustic wave device of claim 1, wherein the seating groove has an L-shaped contour.

12. A method of manufacturing an acoustic wave device, comprising:
    preparing a substrate having an acoustic wave generator formed on one surface thereof;
    forming a support portion and a protective member along a circumference of the acoustic wave generator on a surface of the substrate, wherein the protective member is partially embedded in a seating groove having a ledge formed in the support portion; and
    forming an encapsulating portion encapsulating the support portion and the protective member.

13. The method of claim 12, wherein the forming of the support portion and the protective member comprises:
    preparing the protective member on a carrier substrate;
    disposing the support portion along an edge of the protective member;
    transferring the protective member and the support portion to one surface of the substrate; and
    removing the carrier substrate.

14. The method of claim 13, wherein the preparing the protective member on the carrier substrate comprises:
    forming a metal layer on the carrier substrate;
    forming a first pattern by forming and patterning a first mask layer on the metal layer; and
    filling a conductive material in the first pattern.

15. The method of claim 14, further comprising, before the forming of the encapsulating portion, forming an airtight layer along surfaces of the support portion and the protective member.

16. The method of claim 13, wherein the forming of the support portion further comprises forming an opening in the support portion.

17. The method of claim 16, further comprising, after the forming of the support portion and the protective member, forming a connection conductor by filling a conductive material in the opening.

18. An acoustic wave device, comprising:
    a support portion disposed on a substrate, and having a through hole configured to accommodate an acoustic wave generator;
    a seating groove having a ledge defined on an inner upper surface contour of the through hole on the support portion; and
    a protective member disposed over the through hole, and seated in the seating groove.

19. The acoustic wave device of claim 18, further comprising an airtight layer disposed between an encapsulating layer and upper surfaces of the support portion and the protective member.

20. The acoustic wave device of claim 19, wherein the upper surfaces of the support portion and the protective member are on different planes.

21. The acoustic wave device of claim 19, wherein the upper surfaces of the support portion and the protective member are on a same plane.

\* \* \* \* \*